United States Patent
Heuck et al.

(10) Patent No.: US 10,615,138 B2
(45) Date of Patent: Apr. 7, 2020

(54) METHOD FOR PRODUCING A CONNECTING MEDIUM ON AN ASSEMBLY PARTNER, METHOD FOR PRODUCING A MATERIAL-FIT CONNECTION BETWEEN AN ASSEMBLY PARTNER AND A METAL LAYER, AND A SYSTEM FOR CARRYING OUT THE METHODS

(71) Applicant: Infineon Technologies AG, Neubiberg (DE)

(72) Inventors: Nicolas Heuck, Cremlingen (DE); Marco Marchitto, Bad Sassendorf (DE); Roland Speckels, Kamen (DE)

(73) Assignee: Infineon Technologies AG, Neubiberg (DE)

( * ) Notice: Subject to any disclaimer, the term of this patent is extended or adjusted under 35 U.S.C. 154(b) by 986 days.

(21) Appl. No.: 15/010,727

(22) Filed: Jan. 29, 2016

(65) Prior Publication Data
US 2016/0225735 A1    Aug. 4, 2016

(30) Foreign Application Priority Data
Jan. 30, 2015  (DE) ......................... 10 2015 101 420

(51) Int. Cl.
*H01L 23/00*    (2006.01)
*H01L 23/373*   (2006.01)
(Continued)

(52) U.S. Cl.
CPC ............ *H01L 24/27* (2013.01); *B23K 1/0016* (2013.01); *B23K 1/018* (2013.01); *B23K 35/025* (2013.01);
(Continued)

(58) Field of Classification Search
CPC ...... H01L 24/27; H01L 23/3735; H01L 24/75; H01L 24/83; H01L 24/29; H01L 24/743;
(Continued)

(56) References Cited

U.S. PATENT DOCUMENTS 5,397,423 A * 3/1995 Bantz ................... B23Q 39/042
156/350
8,299,613 B2   10/2012 Oppermann
(Continued)

FOREIGN PATENT DOCUMENTS

CN    101510498 A     8/2009
DE    102007055017 A1  5/2009
(Continued)

OTHER PUBLICATIONS

Tan, A. C. Tin and Solder Plating in the Semiconductor Industry: a Technical Guide. Chapman & Hall, 1993 (Year: 1993).*

*Primary Examiner* — Kevine E Yoon
*Assistant Examiner* — Ryan L Heckman
(74) *Attorney, Agent, or Firm* — Murphy, Bilak & Homiller, PLLC

(57) ABSTRACT

A method for producing a layer including a connecting medium on an assembly partner is provided. The method includes providing a carrier on which the connecting medium is applied. The connecting medium contains a metal in the form of a multiplicity of metal particles. The assembly partner is placed on the connecting medium located on the carrier and pressed onto the connecting medium located on the carrier, so that a layer of the connecting medium adheres to the assembly partner. The assembly partner together with the layer adhering thereto is removed from the carrier. By means of a gas flow, edges of the layer, at which the latter
(Continued)

extends laterally beyond the assembly partner, are removed so that a layer residue of the layer remains adhering to the assembly partner.

20 Claims, 3 Drawing Sheets

(51) Int. Cl.
*B23K 1/00* (2006.01)
*B23K 1/018* (2006.01)
*B23K 35/02* (2006.01)
*B23K 35/30* (2006.01)

(52) U.S. Cl.
CPC ...... *B23K 35/0244* (2013.01); *B23K 35/3006* (2013.01); *H01L 23/3735* (2013.01); *H01L 24/75* (2013.01); *H01L 24/83* (2013.01); *H01L 24/29* (2013.01); *H01L 24/743* (2013.01); *H01L 2224/27332* (2013.01); *H01L 2224/27442* (2013.01); *H01L 2224/27831* (2013.01); *H01L 2224/27848* (2013.01); *H01L 2224/29294* (2013.01); *H01L 2224/29339* (2013.01); *H01L 2224/29344* (2013.01); *H01L 2224/29347* (2013.01); *H01L 2224/29364* (2013.01); *H01L 2224/29369* (2013.01); *H01L 2224/29373* (2013.01); *H01L 2224/32225* (2013.01); *H01L 2224/32245* (2013.01); *H01L 2224/743* (2013.01); *H01L 2224/75252* (2013.01); *H01L 2224/75315* (2013.01); *H01L 2224/75343* (2013.01); *H01L 2224/75745* (2013.01); *H01L 2224/8384* (2013.01); *H01L 2224/83191* (2013.01); *H01L 2224/83207* (2013.01); *H01L 2924/13055* (2013.01); *H01L 2924/13091* (2013.01)

(58) Field of Classification Search
CPC . H01L 2224/27332; H01L 2224/27442; H01L 2224/27831; H01L 2224/27848; H01L 2224/29294; H01L 2224/29339; H01L 2224/29344; H01L 2224/29347; H01L 2224/29364; H01L 2224/29369; H01L 2224/29373; H01L 2224/32225; H01L 2224/32245; H01L 2224/743; H01L 2224/75252; H01L 2224/75315; H01L 2224/75343; H01L 2224/75745; H01L 2224/83191; H01L 2224/83207; H01L 2224/8384; H01L 2924/13055; H01L 2924/13091; B23K 1/0016; B23K 1/018; B23K 35/0244; B23K 35/025; B23K 35/3006
See application file for complete search history.

(56) References Cited

U.S. PATENT DOCUMENTS

| | | | |
|---|---|---|---|
| 2004/0126923 A1* | 7/2004 | Benson | B08B 5/02 438/58 |
| 2010/0270673 A1* | 10/2010 | Oppermann | H01L 24/83 257/739 |
| 2012/0187430 A1* | 7/2012 | West | H01L 25/0753 257/88 |
| 2015/0014399 A1* | 1/2015 | Ogashiwa | H01L 24/83 228/248.1 |

FOREIGN PATENT DOCUMENTS

| | | | | |
|---|---|---|---|---|
| DE | 102013104572 A1 * | 11/2014 | | H01L 24/11 |
| DE | 102013104572 A1 | 11/2014 | | |
| JP | 08115931 A | 5/1996 | | |
| WO | 9427823 A1 | 12/1994 | | |

\* cited by examiner

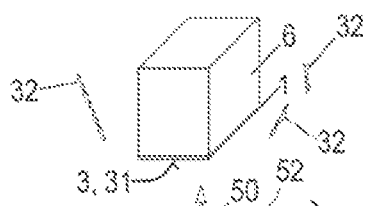
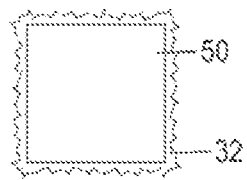
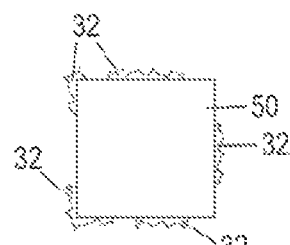
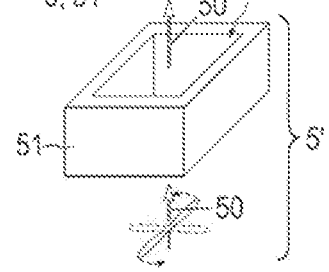
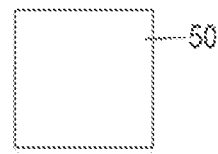
FIG 2  FIG 5  FIG 6
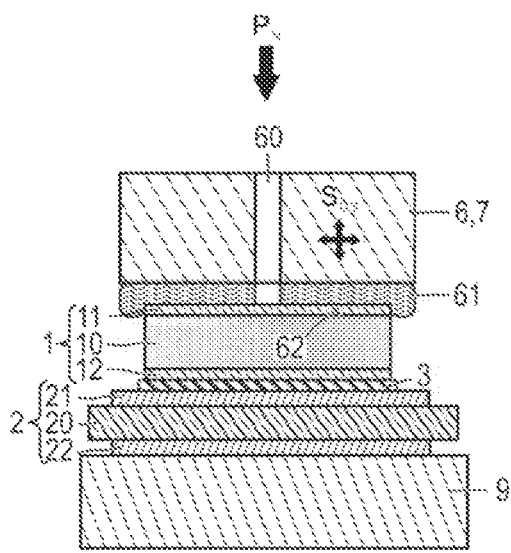
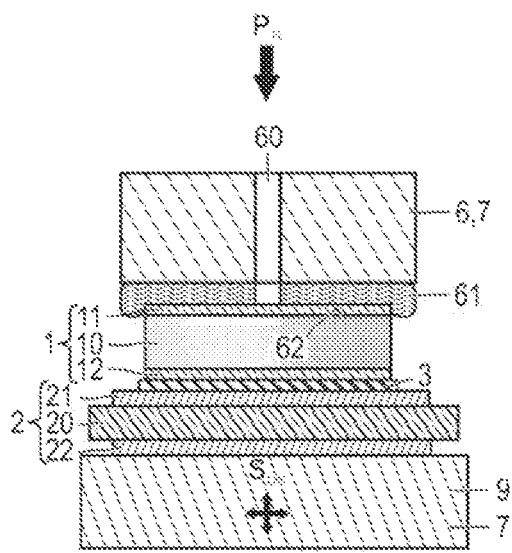
FIG 7  FIG 8

METHOD FOR PRODUCING A CONNECTING MEDIUM ON AN ASSEMBLY PARTNER, METHOD FOR PRODUCING A MATERIAL-FIT CONNECTION BETWEEN AN ASSEMBLY PARTNER AND A METAL LAYER, AND A SYSTEM FOR CARRYING OUT THE METHODS

PRIORITY CLAIM

This application claims priority to German Patent Application No. 10 2015 101 420.3 filed on 30 Jan. 2015, the content of said application incorporated herein by reference in its entirety.

TECHNICAL FIELD

The invention relates to a method for the production of a layer comprising a connecting medium on an assembly partner, to a method for the production of a material-fit connection between an assembly partner and a metal layer, and to a system for carrying out these methods.

BACKGROUND

Because of increasing power densities, more compact designs and new fields of use, it is to be expected that the working temperatures of semiconductor chips will increase further in the future. If the semiconductor chips are mounted on a circuit carrier with the aid of a connecting medium, the connecting medium must also comply with greater requirements in terms of thermal load-bearing capacity. Similar considerations apply not only for semiconductor chips, but also for the thermally stable connection of any other assembly partners to a metallization layer.

Recently, the soft solder compounds conventionally used as connecting media have been replaced increasingly with connecting layers which contain a sintered metal powder. Such sintering compounds have a higher mechanical stability at high application temperatures than soft solder compounds. During the production of such sintering compounds, however, the problem often arises that the process environment is contaminated by metal powder.

SUMMARY

Embodiments of the present invention provide a method for producing a layer containing a connecting medium on an assembly partner, a method for producing a thermally stable material-fit connection between an assembly partner and a metal layer, and a system for carrying out such methods.

According to a first aspect, in order to produce a layer containing a connecting medium on an assembly partner, a carrier is provided, onto which a connecting medium that contains a metal in the form of a multiplicity of metal particles is applied. The assembly partner is placed on the connecting medium located on the carrier, and pressed thereon, so that a layer of the connecting medium adheres to the assembly partner. The assembly partner together with the layer adhering thereto is taken off from the carrier. Edges of the layer, which extend beyond the assembly partner, are removed by means of a gas flow, so that a layer residue of the layer remains adhering to the assembly partner.

According to a second aspect, in order to produce a material-fit connection between a semiconductor chip and a metal layer, an assembly partner is provided, as well as a metal layer which has a mounting section. A connecting medium is produced on the assembly partner according to a method corresponding to the first aspect. The metal particles are sintered in a sintering process. For a predetermined sintering time, the conditions that the connecting medium is arranged between the semiconductor chip and the metal layer, and extends continuously from the semiconductor chip to the metallization layer, that the semiconductor chip and the metal layer are pressed against one another in an application pressure range which lies above a minimum application pressure, and that the connecting medium is kept in a temperature range which lies above a minimum temperature, are satisfied continuously.

A third aspect relates to a system which is configured in order to carry out a method according to the first and/or second aspect.

Those skilled in the art will recognize additional features and advantages upon reading the following detailed description and on viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2 shows the removal of edges, extending laterally beyond an assembly partner, of a layer containing a multiplicity of small metal particles which adheres to the assembly partner, according to another example.

FIG. 3 shows a plan view of an assembly partner on which a layer containing a multiplicity of small metal particles adheres, the layer extending laterally beyond the assembly partner circumferentially.

FIG. 4 shows a plan view of an assembly partner on which a layer containing a multiplicity of small metal particles adheres, the layer extending laterally beyond the assembly partner in individual regions.

FIG. 5 shows a plan view of the assembly partner according to FIG. 3 or 4 after the removal of the parts of the layer extending laterally beyond the assembly partner by means of a gas flow.

FIG. 6 shows a side view of the arrangement according to FIG. 5.

FIG. 7 shows a method in which, in order to produce a material-fit connection between a semiconductor chip and a metal layer, a sound signal is coupled into the connecting medium through the semiconductor chip.

FIG. 8 shows a method in which, in order to produce a material-fit connection between a semiconductor chip and a metal layer, a sound signal is coupled into the connecting medium through the metal layer.

DETAILED DESCRIPTION

The representation in the figures described in more detail below is not to scale. Unless otherwise indicated, the same references denote elements which are the same or have the same effect in the figures.

FIGS. 1A to 1H show various steps of a method for the production of a material-fit connection between a metal layer 21 and an assembly partner 1, which is configured by way of example as a semiconductor chip. The method may, however, also be carried out correspondingly with other assembly partners.

Figure 1:
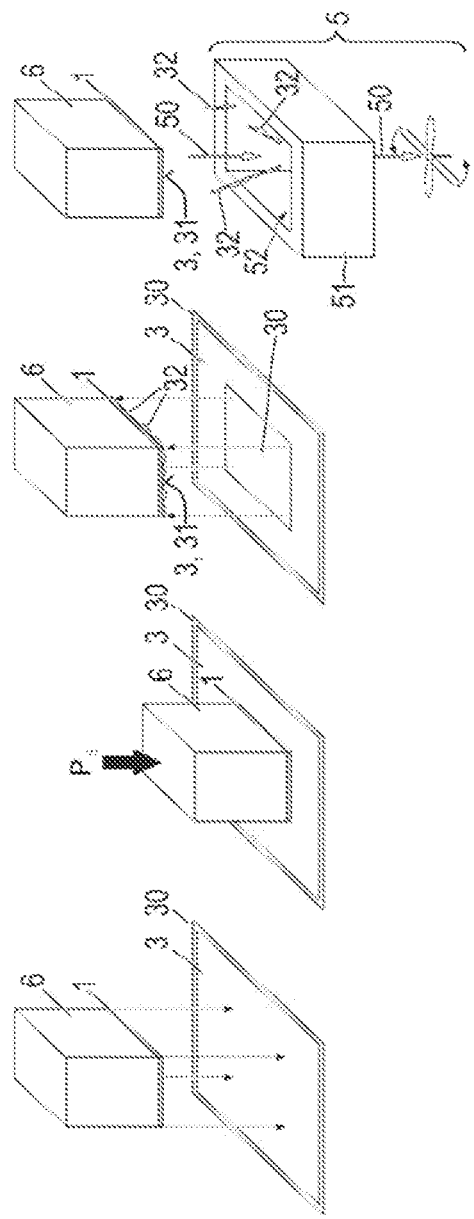
FIGS. 1A to 1H show various steps of a method for producing a material-fit connection between a semiconductor chip and a metal layer.

FIG. 1A shows a carrier 30, onto which a connecting medium 3 is applied. A transfer film, or alternatively a rigid carrier, may be used as the carrier 30.

The applied connecting medium 3 may have the form of a layer 31, in particular a planar layer. The connecting medium 3 contains at least one metal in the form of a multiplicity of small metal particles. Above all, noble metals such as for example silver, gold, platinum, palladium, rhodium, but also non-noble metals, for example copper, are suitable as metals. The metal, i.e. the totality of the multiplicity of the small metal particles, may consist entirely of precisely one of said metals, or comprise precisely one of these metals, although it may also consist of metal powder mixtures of two or more of said metals, or comprise such a metal powder mixture. The connecting medium 3 may be present as a powder in dry form or essentially dry form. Likewise, however, the connecting medium 3 may also be a paste which contains a mixture of such a metal powder and a solvent.

Silver is preferably used as the metal, since the sintered layer produced therefrom has an outstanding electrical as well as thermal conductivity, which is important above all in the field of power electronics, for example when semiconductor chips are intended to be connected and/or cooled by means of the finished sintered connecting layer. The particles of the dry metal powder, or of the metal powder forming the component of a paste, may for example be configured as small particles, and/or as flakes. Optionally, the dry or paste-like connecting medium 3 may also contain wax powder from the grinding of the metal into a powder.

If the connecting medium 3 applied onto the carrier 30 is a paste, it is dried strongly so that the components of the connecting medium 3 (in particular the metal particles) which remain after the drying have no residual moisture, or only little residual moisture. Then, as indicated with the aid of arrows in FIG. 1A and shown as a result in FIG. 1B, the semiconductor chip 1 is placed on the applied dry, or dried, connecting medium 3, which may for example be done with the aid of a placement tool 6, although it may in principle be done in any desired way.

After the placement, the semiconductor chip 1 is pressed by the placement tool 6 or in another way with an application pressure Ps against the connecting medium 3 lying on the carrier 30, so that the connecting medium 3 adheres to the semiconductor chip 1. The application pressure Ps may, for example, be selected to be greater than 0.1 MPa and/or less than 20 MPa.

Before and/or after placement on the connecting medium 3, the semiconductor chip 1 may be heated to temperatures which are above room temperature, for example to more than 50° C., in order to achieve reliable adhesion of the connecting medium 3 to the semiconductor chip 1. The temperatures of the connecting medium 3, of the semiconductor chip 1 and of the metal layer 21 in this case lie below the temperature at which the metal powder contained in the connecting medium 3 is sintered.

Figure 10:
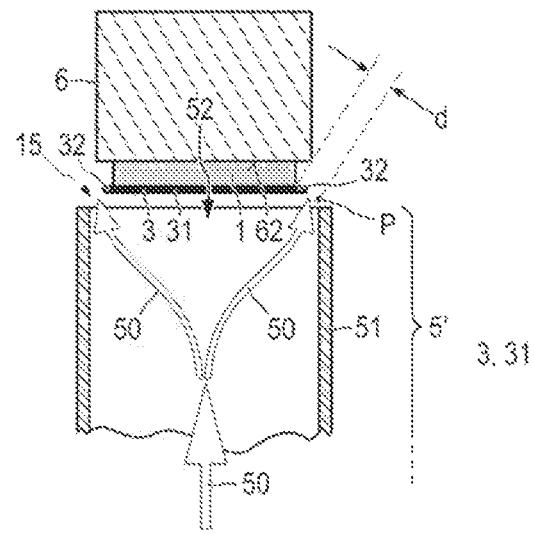
FIG. 10 shows the removal of edges, extending laterally beyond an assembly partner, of a layer containing a multiplicity of small metal particles which adheres to the assembly partner, by means of a gas flow which is generated by means of a blowing tube.

As is furthermore shown in FIG. 10, the semiconductor chip 1 with the connecting medium 3 adhering thereto may be lifted off from the carrier 30 again. After the lifting, there is a layer 31 of the connecting medium 3 on the lower side of the semiconductor chip 1, which may extend laterally beyond the semiconductor chip 1 circumferentially or in individual regions. The laterally protruding sections of the layer 31 of the connecting medium 3 are denoted by the reference 32 in FIG. 10.

Since these sections 32 extending laterally beyond the semiconductor chip 1 could easily fall off in the further process steps and contaminate the process environment in an uncontrolled way, the laterally protruding sections 32 and other components of the connecting layer 3 hanging from the semiconductor chip 1 with only low adhesion, are removed in a controlled way from the semiconductor chip 1 by means of a gas flow 50, as schematically shown in FIG. 1D. The gas flow 50, for example an airflow, may be generated by means of a suction device 5 or another suitable device. For example, the suction device 5 may have a tube 51 with an opening 52 facing toward the semiconductor chip 1 and the placement tool 6, through which air (or another gas) from the environment of the semiconductor chip 1 is sucked. In relation to the air (or another gas) immediately surrounding the semiconductor chip 1, the tube 51 therefore forms a suction tube.

The semiconductor chip 1 with the connecting medium 3 adhering thereto may now be placed on a chip mounting section 21c of a metal layer 21, for example by means of the placement tool 6 or in another way, so that the connecting medium 3 lies between the semiconductor chip 1 and the chip mounting section 21c and extends continuously from the semiconductor chip 1 to the chip mounting section 21c, and therefore to the metal layer 21, which is represented in FIG. 1E with the aid of arrows and as a result in FIG. 1F.

The metal layer 21 may in principle be any desired metal layer. It may be present as a single part, for example as a lead frame, or alternatively as a component of a circuit carrier 2. In the example represented, the metal layer 21 is a component of a circuit carrier 2 which comprises at least one dielectric insulation carrier 20, for example a ceramic, as well as an optional lower metal layer 22. Such a circuit carrier 2 is also represented by way of example in FIGS. 7 and 8.

The metal layer 21 may (before the placement of the semiconductor chip 1) overall be planar, or alternatively curved. Optionally, at least the chip mounting section 21c (before the placement of the semiconductor chip 1) may be planar. A planar mounting surface facilitates the chip mounting and reduces the risk of chip fracture.

According to an option represented in FIG. 1E (with the aid of stylized flames below the placement tool 6), the metal layer 21 may be preheated before the placement of the semiconductor chip 1, for example to temperatures of at least 100° C., so that the sintering process after the placement of the semiconductor chip 1, including the connecting medium 3 adhering thereto, on the metal layer 21 begins almost without delay, so that the process time can be significantly shortened. Optionally, the metal layer 21 may be heated to temperatures which are lower than 400° C. during the preheating in order to keep the thermal loading of the semiconductor chip 1 after the placement small.

The heating of the metal layer 21 may, for example, be carried out by means of a heat source (not represented in detail) which heats the metal layer 21 via its side facing away from the chip mounting section 21c. The heat source may for example be a heatable and/or preheated block, for example a metal block, which is brought in contact with the side facing away from the chip mounting section 21c. In order to heat or preheat the block, it may for example have an integrated heating resistor. Likewise, however, a hot air blower or a radiation heater may be used as the heat source.

In order to prevent the metal particles of the connecting medium 3 adhering in the semiconductor chip 1 from already beginning to sinter significantly before the semiconductor chip 1 with the connecting medium 3 adhering thereto is placed on the chip mounting section 21c, the semiconductor chip 1 may be kept from the placement of the semiconductor chip 1 on the carrier 30 provided with the connecting medium 3 (FIG. 1B) until the placement of the semiconductor chip 1 with the connecting medium 3 adhering thereto onto the metal layer 21 (FIG. 1F), at temperatures which are so low that the metal particles do not begin to sinter, or do not begin to sinter significantly, for example at temperatures in the range of below 100° C.

After the placement of the semiconductor chip 1 and the connecting medium 3 adhering thereto on the chip mounting section 21c, the placement tool 6 may optionally be heated in order to accelerate the sintering of the metal particles contained in the connecting medium 3. In order to heat the placement tool 6, it may for example have an integrated heating resistor.

As is furthermore represented in FIGS. 1F and 1G, the semiconductor chip 1 is pressed with an application pressure $P_N$ against the chip mounting section 21c, and therefore against the metal layer 21. Optionally, the application pressure $P_N$ may be generated by the placement tool 6, to which end a support (not represented), which forms a counterbrace, is required on the side of the metal layer 21 facing away from the placement tool 6. Irrespective of the way in which it is generated, the range of the application pressure may be selected in such a way that it lies above a minimum application pressure, for example above 0.1 MPa.

The pressing is furthermore carried out in such a way that the connecting medium 3 is simultaneously at high temperatures so that the metal powder contained in the connecting medium 3 is sintered and a stable sintered metal powder layer is formed, which furthermore connects the semiconductor chip 1 and the metal layer 21 firmly and with a material fit. For example, the temperatures of the connecting medium 3 during the pressing may be kept at temperatures which lie above a minimum temperature, for example above 100° C.

As an alternative, it would also be possible to remove the placement tool 6 from the semiconductor chip 1 while the semiconductor chip 1 together with the connecting medium 3 remains on the chip mounting section 21c, and to carry out the pressing and heating by means of a separate press into which the stack consisting of the metal layer 21, the semiconductor chip 1 placed on the chip mounting section 21c of the latter, and the connecting medium 3 lying between the chip mounting section 21c and the semiconductor chip 1 is placed.

As furthermore represented in FIG. 1G, a sound signal $S_{US}$ may optionally be coupled into the connecting medium 3 for the sintering. To this end, a sound generator (not represented), for example a piezoelectric sound generator, which may for example be integrated into the placement tool 6, is used. The sound signal $S_{US}$ coupled in supplies energy and causes compression of the metal particles contained in the connecting medium 3, so that both the sintering time can be shortened and the quality of the sintered connection can be increased (reduction of the porosity factor).

The sintering of the metal particles is in any event carried out in a sintering process in which the conditions that the connecting medium 3 is arranged between the semiconductor chip 1 and the metal layer 21 and extends continuously from the semiconductor chip 1 to the metallization layer 21, that the semiconductor chip 1 and the metal layer 21 are pressed against one another in an application pressure range which lies above a minimum application pressure, that the connecting medium 3 is kept in a temperature range which lies above a minimum temperature, and optionally that a sound signal $S_{US}$ is coupled into the connecting medium 3, are satisfied without interruption for a predetermined sintering time.

FIG. 1H shows the finished assembly, in which the semiconductor chip 1 and the metal layer 21 are connected to one another by the sintered connecting medium 3 firmly and with a material fit and optionally also electrically conductively.

The transfer process explained with the aid of FIGS. 1A to 1H, in which the connecting medium 3 is applied onto the semiconductor chip 1 by placing the semiconductor chip 1 on the carrier 30 provided with the connecting medium 3 and by subsequently lifting the semiconductor chip 1, with the connecting medium 3 adhering thereto, off from the carrier 30, offers the advantage that all the process steps can be carried out fully automatically on the same machine.

The removal, explained with reference to FIG. 1D, of the sections 32 (FIG. 1D) by means of a gas flow 50 need not necessarily be carried out by means of a suction device 5. As an alternative, or in addition, the gas flow 50 may be generated by means of a blower 5', which is shown schematically in FIG. 2. In this case as well, the suction device 5' may optionally have a tube 51 with an opening 52 facing toward the semiconductor chip 1 and the placement tool 6. In this case, however, air (or another gas) is ejected from the opening 52 in the direction of the semiconductor chip 1 and the placement tool 6, and therefore also in the direction of the layer 31.

FIGS. 3 and 4 show further plan views of semiconductor chips 1, to the concealed lower sides of which a layer 31 of the connecting medium 3 respectively adheres, which, as explained with reference to FIG. 10, extends beyond the semiconductor chip 1 in regions 32 circumferentially (FIG. 3) or in sections (FIG. 4). FIGS. 3 and 4 show a situation corresponding to FIG. 10, the placement tool 6 not being shown for reasons of clarity.

FIG. 5 shows the plan view of a semiconductor chip 1 as explained with the aid of FIGS. 3 and 4, after the removal of the regions extending laterally beyond the semiconductor chip 1 by means of a gas flow. A residue of the layer 31 of the connecting medium 3, remaining after the removal of the sections 32, remains adhering as before to the concealed lower side of the semiconductor chip 1. A side view of the arrangement according to FIG. 5 is shown by FIG. 6.

FIG. 7 shows another optional configuration of the method, in which, in order to produce a material-fit connection between a semiconductor chip 1 and a metal layer 21, a sound signal $S_{US}$ is coupled into the connecting medium 3 through the semiconductor chip 1. The generation of the sound signal $S_{US}$ is carried out by means of a sound generator 7 (not represented in detail), which may be integrated into the placement tool 6.

On the side on which it receives the semiconductor chip 1, the placement tool 6 may furthermore have an optional resilient pressure cushion 61 in order to avoid damage to the semiconductor chip 1. For example, an elastomer plastic (for example natural or synthetic rubbers and variants thereof), a thermoelastic plastic (for example polytetrafluoroethylene=PTFE), or a thermoplastic plastic (for example polyimide=PI), are suitable as a pressure cushion 61.

Furthermore, the placement tool 6 may have a suction channel 60 through which the semiconductor chip 1 can be suctioned and held on the placement tool 6. If the placement tool 6 has a pressure cushion 61, the suction channel 60 may also extend through the pressure cushion 61.

The counterbearing 9 (not shown in FIGS. 1A to 1H but nevertheless present), is furthermore also shown in FIG. 7.

As is furthermore illustrated in FIG. 8, according to a likewise optional configuration of the method, a sound signal $S_{US}$ may also be coupled into the connecting medium 3 through the metal layer 21. The generation of this sound signal $S_{US}$ is carried out by means of a sound generator 7 (not represented in detail), which may be integrated into the counterbearing 9.

Likewise, it is naturally possible to couple one partial signal of the sound signal $S_{US}$ into the connecting medium 3 through the placement tool 6 as explained with the aid of FIG. 7, and a further partial signal through the metal layer 21 as explained with the aid of FIG. 8.

As is furthermore illustrated particularly in FIGS. 7 and 8, the placement tool 6 may fully cover the semiconductor chip 1 during the sintering time.

As already mentioned above, the metal layer 21 may be a single metal part, for example a lead frame, or, as represented merely by way of example in the preceding figures, a metallization layer 21 of a circuit carrier 2, see also especially FIGS. 7 and 8.

The circuit carrier 2 has a dielectric insulation carrier 20, onto which an upper metallization layer 21 is applied, as well as an optional lower metallization layer 22. If an upper and a lower metallization layer 21, 22 are present, these lie on mutually opposite sides of the insulation carrier 20. The upper metallization layer 21 may if required be structured, so that it has conductive tracks that may be used, for example, for electrical interconnection and/or for chip mounting. The dielectric insulation carrier 20 may be used in order to insulate the upper metallization layer 21 and the lower metallization layer 22 electrically from one another.

The circuit carrier 2 may be a ceramic substrate, in which the insulation carrier 20 is formed as a thin layer that comprises ceramic or consists of ceramic. Highly electrically conductive metals, for example copper or copper alloys, aluminum or aluminum alloys, but also any other metals or alloys, are suitable as materials for the upper metallization layer 21 and, if present, the lower metallization layer. If the insulation carrier 20 comprises ceramic or consists of ceramic, the ceramic may for example be aluminum oxide ($Al_2O_3$) or aluminum nitrite (AlN) or zirconium oxide ($ZrO_2$), or a mixed ceramic which, besides at least one of said ceramic materials, also comprises at least one further ceramic material different thereto. For example, a circuit carrier 2 may be configured as a DCB substrate (DCB=Direct Copper Bonding), as a DAB substrate (DAB=Direct Aluminum Bonding), as an AMB substrate (AMB=Active Metal Brazing) or as an IMS substrate (IMS=Insulated Metal Substrate). The upper metallization layer 21 and, if present, the lower metallization layer 22 may independently of one another respectively have a thickness in the range of from 0.05 mm to 2.5 mm. The thickness of the insulation carrier 20 may, for example, lie in the range of from 0.1 mm to 2 mm. Thicknesses greater or less than those indicated are, however, likewise possible.

The semiconductor chip 1 may in principle be any desired semiconductor chip, for example a MOSFET (Metal Oxide Semiconductor Field Effect Transistor), an IGBT (Insulated Gate Bipolar Transistor), a thyristor, a JFET (Junction Field Effect Transistor), an HEMT (High Electron Mobility Transistor), a diode, etc. The semiconductor chip 1 has a semiconductor body 10 and, in each case optionally, an upper chip metallization 11 and a lower chip metallization 12. If a semiconductor chip 1 has a lower chip metallization 12, it may be fastened thereon on the metal layer 21. This means that the connecting medium 3 extends continuously from the chip mounting section 21c to the lower chip metallization 12, and connects these to one another electrically conductively, during the sintering process and after the end of the sintering process.

The connecting methods may respectively be configured as pick-and-place methods, which means that the sintered connection between the semiconductor chip 1 and the metal layer 21 is already carried out during the placement process, by the placement tool 6 being used both to take the semiconductor chip 1 and place it on the chip mounting surface 21c, and to generate the application pressure $P_N$ which acts during the sintering time.

All variants of the method may be carried out in such a way that the metal powder contained in the connecting medium 3 is not melted.

Further examples of possible configurations of the removal of edges 32 of a layer 31 adhering to a semiconductor chip 1 by means of a gas flow 50, with the use of a tube 51, will now be explained with the aid of FIGS. 9 to 10. In the examples according to FIGS. 9 and 11, the gas flow 50 is generated by means of suction 5 (the tube 51 then forms a suction tube), while in the examples according to FIGS. 10 and 12 it is generated by means of a blower 5' (the tube 51 then forms a blowing tube). The flow of the gas is respectively illustrated by the white filled-in arrows.

Between the opening 52 of the tube 51 and the semiconductor chip 1, and between the opening 52 of the tube 51 and the protruding edge or edges 32, a gap 15 respectively remains, through which the gas flow 50 must pass. The flow rate of the gas flow 50, prevailing in the region of the semiconductor chip 1 and of the edges 32, can in this case be adapted by means of the width of the gap 15 in such a way that, of the layer 31, essentially only the edges 32 extending laterally beyond the semiconductor chip 1 are removed by the gas flow 50. Suitable gap widths may be determined in a straightforward way experimentally by varying the distance between the tube opening 52 and the semiconductor chip 1.

Figure 9:
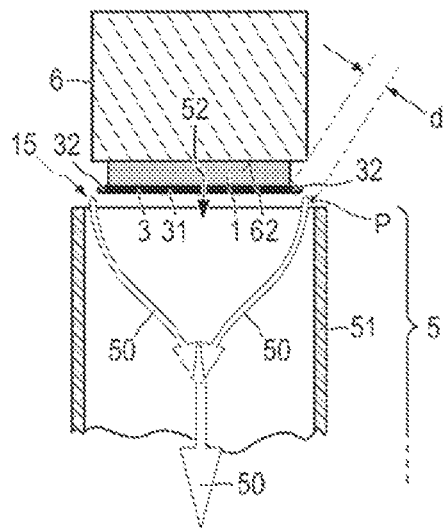
FIG. 9 shows the removal of edges, extending laterally beyond an assembly partner, of a layer containing a multiplicity of small metal particles which adheres to the assembly partner, by means of a gas flow which is sucked out by means of a suction tube.
Figure 11:
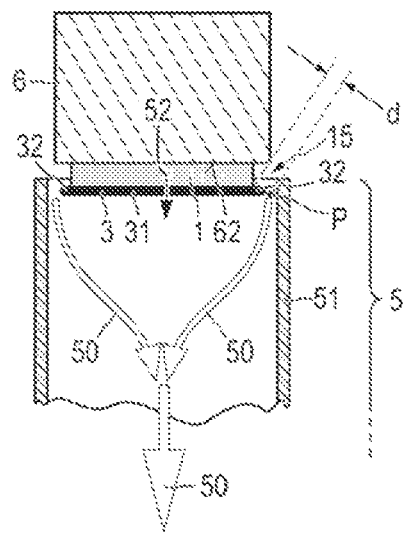
FIG. 11 shows the removal of edges, extending laterally beyond an assembly partner, of a layer containing a multiplicity of small metal particles which adheres to the assembly partner, by means of a suction device having a suction tube, the layer and at least partially the assembly partner penetrating into the suction tube.
Figure 12:
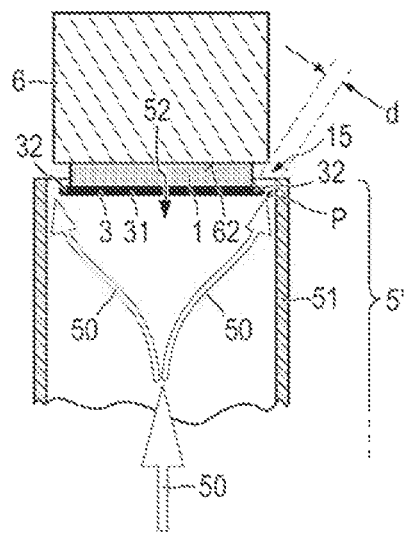
FIG. 12 shows the removal of edges, extending laterally beyond an assembly partner, of a layer containing a multiplicity of small metal particles which adheres to the assembly partner, by means of a gas flow which is generated by means of a blowing tube, the layer and at least partially the assembly partner penetrating into the suction tube.

During the removal of the edges 32 with the aid of the gas flow 50, the semiconductor chip 1 and the layer 31 may lie outside the tube 51, as illustrated in FIGS. 9 and 10, although they may also lie fully or at least partially inside the tube 51, as illustrated in FIGS. 11 and 12. Of course, any desired intermediate positions are possible.

In order to ensure that the edges 32 extending laterally beyond the semiconductor chip 1 are removed reliably, the gas flow 50 may be adjusted in such a way that the gas flow 50 has a flow rate of at least 2.5 m³/s at a position P, the distance d of which from the semiconductor chip 1 is not greater than 10 cm.

In the exemplary embodiments shown, the opening 52 of the tube 50 respectively lies below the lower side 62 of the setting or (pick-and-place) tool 6. Likewise, however, the opening 52 could also lie above the lower side 62, or at the same height as the latter.

In all configurations, for example, instead of only one tube 51 it is also possible to use a plurality of tubes 51, each with an opening 52, or a tube 51 which instead of only one opening 52 has an annular nozzle with a plurality of outlet orifices (i.e. likewise a plurality of openings 52). In the case of a plurality of openings 52, these may be arranged at a short distance along the lateral edge of the semiconductor chip 1, i.e. close to the regions at which the protruding edges 32 of the layer 31 can be formed, so that the lateral edge region of the semiconductor chip 1 is fully encompassed by the gas flow 50.

A system with which one of the methods explained above may be carried out has at least a setting (pick-and-place) tool 6, as well as a device 5, 5' for generating a gas flow 50, and optionally also further devices which have been explained in relation to the carrying out of the respectively described methods. In the case of a device 5, 5', having (at least) one suction or (at least) one blowing tube 51, for generating a gas flow 50, the setting or (pick-and-place) tool 6 may be positionable in such a way that a distance in the range of from 0.1 mm to 20 cm can be adjusted between a chip reception region of the setting or (pick-and-place) tool 6 and the end of the tube 51 where the opening 52 is located. The chip reception region is in this case defined by the contact surface of the setting or (pick-and-place) tool 6 which can be in direct contact with a semiconductor chip 1 held by it. In FIGS. 9 to 12, for example, the chip reception region is defined by the (lower) side 62, facing toward the tube 51, of the setting or (pick-and-place) tool 6. In FIGS. 7 and 8, the lower side 62 is formed by the lower side of the pressure cushion 61 (which constitutes a component of the setting or (pick-and-place) tool 6).

With the present invention, uncontrolled contamination of the process environment is reduced effectively in comparison with conventional methods, by parts of the connecting medium adhering less strongly to the assembly partner being removed from the assembly partner in a controlled way.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a layer comprising a connecting medium on an assembly partner, the method comprising:
   providing a carrier on which a connecting medium that contains a metal in the form of a multiplicity of metal particles is applied;
   placing the assembly partner on the connecting medium located on the carrier;
   pressing the assembly partner onto the connecting medium located on the carrier, so that a layer of the connecting medium adheres to the assembly partner;
   removing the assembly partner with the layer adhering thereto from the carrier; and
   removing edges of the layer, at which the latter extends laterally beyond the assembly partner, by means of a gas flow, so that a layer residue of the layer remains adhering to the assembly partner.

2. The method of claim 1, wherein the assembly partner is a semiconductor chip.

3. The method of claim 1, wherein the connecting medium comprises a dry metal powder.

4. The method of claim 3, wherein the dry metal powder comprises a noble metal powder.

5. The method of claim 4, wherein the noble metal powder is a silver powder.

6. The method of claim 1, wherein the gas flow is generated by a suction or by blowing.

7. The method of claim 6, wherein the suction or the blowing is carried out with the aid of a tube which has an opening with which the tube is directed at the assembly partner.

8. The method of claim 7, wherein the opening is separated from the assembly partner by no more than 20 cm during action of the gas flow on the edges.

9. The method of claim 1, wherein the gas flow has a flow rate of at least 2.5 m³/s at a point which is separated from the assembly partner by no more than 10 cm.

10. A method for producing a material-fit connection between an assembly partner and a metal layer, the method comprising:
   providing an assembly partner;
   providing a metal layer which has a mounting section;
   producing a layer comprising a connecting medium on the assembly partner by:
      placing the assembly partner on the connecting medium, the connecting medium containing a metal in the form of a multiplicity of metal particles;
      pressing the assembly partner onto the connecting medium, so that a layer of the connecting medium adheres to the assembly partner;
      removing the assembly partner with the layer adhering thereto; and
      removing edges of the layer, at which the latter extends laterally beyond the assembly partner, by means of a gas flow, so that a layer residue of the layer remains adhering to the assembly partner;
   sintering the metal particles in a sintering process in which the following conditions are satisfied without interruption for a predetermined sintering time:
      the connecting medium is arranged between the assembly partner and the metal layer, and extends continuously from the assembly partner to the metal layer;

the assembly partner and the metal layer are pressed against one another in an application pressure range which lies above a minimum application pressure; and the connecting medium is kept in a temperature range which lies above a minimum temperature.

11. The method of claim 10, wherein a minimum application pressure is 0.1 MPa.

12. The method of claim 10, wherein a minimum temperature is 100° C.

13. The method of claim 10, wherein, before the sintering process, the assembly partner is received by a placement tool and placed on the mounting section in such a way that the connecting medium is arranged between the assembly partner and the mounting section and extends continuously from the assembly partner to the mounting section.

14. The method of claim 13, wherein the assembly partner and the metal layer are pressed against one another by the placement tool during the predetermined sintering time.

15. The method of claim 13, wherein the placement tool fully covers the assembly partner during the predetermined sintering time.

16. The method of claim 10, wherein a sound signal is coupled into the connecting medium during the predetermined sintering time.

17. The method of claim 10, wherein the metal particles are not melted during the predetermined sintering time.

18. The method of claim 10, wherein the predetermined sintering time is less than 3 min.

19. A system, comprising:
a setting tool configured to receive an assembly partner and a metal layer which has a mounting section, and produce a layer comprising a connecting medium on the assembly partner by placing the assembly partner on the connecting medium, the connecting medium containing a metal in the form of a multiplicity of metal particles, pressing the assembly partner onto the connecting medium, so that a layer of the connecting medium adheres to the assembly partner and removing the assembly partner with the layer adhering thereto; and a device configured to direct a gas flow at the layer, so as to remove edges of the layer, at which the latter extends laterally beyond the assembly partner, so that a layer residue of the layer remains adhering to the assembly partner, wherein the setting tool is further configured to cover the assembly partner during a sintering process in which the metal particles are sintered and in which the following conditions are satisfied without interruption for a predetermined sintering time: the connecting medium is arranged between the assembly partner and the metal layer, and extends continuously from the assembly partner to the metal layer; the assembly partner and the metal layer are pressed against one another in an application pressure range which lies above a minimum application pressure; and the connecting medium is kept in a temperature range which lies above a minimum temperature.

20. A system, comprising:
a setting tool configured to receive a carrier on which a connecting medium that contains a metal in the form of a multiplicity of metal particles is applied, place an assembly partner on the connecting medium located on the carrier, press the assembly partner onto the connecting medium located on the carrier, so that a layer of the connecting medium adheres to the assembly partner, and remove the assembly partner with the layer adhering thereto from the carrier; and a device configured to direct a gas flow at the layer, so as to remove edges of the layer, at which the latter extends laterally beyond the assembly partner, so that a layer residue of the layer remains adhering to the assembly partner.

* * * * *